April 11, 1967 W. BACHNICK 3,314,011

UHF-VHF COMBINED ARCUATE TUNER

Filed Dec. 20, 1963 2 Sheets-Sheet 1

INVENTOR
Werner Bachnick

BY Spencer & Kaye

ATTORNEYS

April 11, 1967 W. BACHNICK 3,314,011

UHF-VHF COMBINED ARCUATE TUNER

Filed Dec. 20, 1963 2 Sheets-Sheet 2

INVENTOR
Werner Bachnick

BY Spencer & Kaye
ATTORNEYS 3,314,011

UHF-VHF COMBINED ARCUATE TUNER

Werner Bachnick, Bredenbeck, Germany, assignor to Telefunken Patentverwertungs G.m.b.H., Ulm (Danube), Germany Filed Dec. 20, 1963, Ser. No. 332,043
Claims priority, application Germany, Dec. 20, 1962, T 23,237
21 Claims. (Cl. 325—459)

The present invention relates to a tuner for UHF (ultra-high frequency) equipment, particularly television receivers, which tuner is capable of being switched over for operating at lower frequency bands, namely, the VHF (very-high frequency) bands. The UHF range of the electromagnetic wave spectrum is, conventionally, considered that portion of the frequency spectrum which is between 300 and 3,000 megacycles and the VHF range is that portion of the frequency spectrum which is between 30 and 300 megacycles.

Conventionally, television receivers are tuned throughout the UHF region by means of a UHF tuner and throughout the VHF region by means of VHF channel switch which is separate from the UHF tuner. The two tuners put out the same IF (intermediate frequency) which is then applied to the receiver where it is amplified further. Such an arrangement requires two structural entities, and two separate amplifiers are needed for operation in the UHF and VHF ranges, respectively.

In certain television receivers, the two above-described tuners are combined with each other by means of a set of push buttons, so that each tuner can be switched in by pressing the corresponding push button. While such an arrangement simplifies the operation of the receiver, it does not eliminate the need for separate tuners.

It is inherently difficult to combine the two separate tuners into a single unit because, due to the fact that they are intended to operate at widely differing frequencies, their structural arrangements differ markedly from each other. The VHF tuner uses concentrated or so-called lumped circuit components, while the UHF tuner requires the use of capacitatively or inductively tunable tank circuits.

It is, therefore, an object of the present invention to provide an arrangement which overcomes the above disadvantages, namely, a tuner arrangement which incorporates a single tuner unit usable for both UHF and VHF and which allows one amplifier to be used simultaneously as amplifier and oscillator for both UHF and VHF.

With the above objects in view, the present invention is based on a tuner of the type suitable for UHF, which tuner has a tuning circuit whose inductance is constituted by an inner, preferably arcuate yoke-like conductor which is arranged within a closed chamber. This inner conductor is insulated with respect to the outer conductor constituted by the wall of the tuner casing and is connected to one of the electrodes of the amplifier element. In order to afford tuning over the VHF range, a slide is provided which metallically connects the inner conductor, at any point along its length, to the wall or outer conductor. According to the preesnt invention, the slide is made to be movable beyond the end of the inner conductor, whereat pairs of contacts are provided by means of which any one of several VHF circuits, which are made up of lumped circuit elements, can be connected to the amplifier. The slide is then movable between the contacts of each pair so as to bridge the same, thereby to establish an electrical connection between the VHF circuit and the amplifier.

By virtue of the fact that the slide, at any one time, connects either the inner conductor or one of the VHF circuits to the amplifier, the UHF tuning means and the various VHF tuning means will have no effect on each other. The UHF circuit, i.e., an open quarter wavelength circuit, which remains connected to the amplifier during VHF operation acts as an acceptor circuit which is tuned to a fixed frequency at the lower end of the UHF band and does not interfere with VHF reception. Moreover, the same amplifier tube is used for both UHF and VHF operation.

According to a further feature of the present invention, the input of the amplifier is connected with a selector switch which connects a VHF or UHF input terminal to the amplifier input. This selector switch is mechanically coupled with the mechanism which moves the slide so as to switch between UHF and VHF reception in accordance with the position of the slide, i.e., the selector switch will connect the amplifier input to the UHF input terminal so long as the slide coacts with the inner conductor of the UHF tuning circuit, whereas the selector switch will connect the amplifier input to the VHF input terminal after the slide has moved beyond the inner conductor and coacts with one of the pairs of contacts by means of which a VHF circuit is connected to the amplifier.

In accordance with yet another feature, a suitable indexing mechanism is provided for holding the slide in any one of a number of desired positions, particularly in the VHF range.

Additional objects and advantages of the present invention will become apparent upon consideration of the following description when taken in conjunction with the accompanying drawings in which:

FIGURE 1 is a sectional view of one embodiment of a tuner according to the present invention.

FIGURE 1*a* is a sectional view showing a modification of the entity incorporating the inner conductor and some of the contacts by means of which the VHF components are connected to the amplifier.

FIGURE 1*b* shows an indexing mechanism which can be used for holding the tuner in any of a number of different positions.

Figure 1:
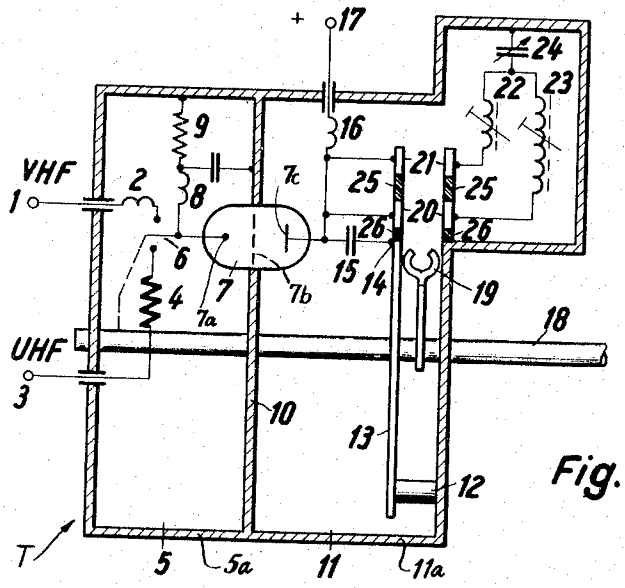

Referring now to the drawings and to FIGURE 1 thereof in particular, the same shows a tuner T according to the present invention, this tuner having a terminal 1 to which the VHF voltage is applied, an inductance coil 2 one end of which is connected to the terminal 1, a further terminal 3 to which the UHF voltage is applied, and a matching element 4 one end of which is connected to terminal 3. The inductance 2 and the element 4 are arranged in a chamber 5 of the tuner. A selector switch 6, connected to the cathode 7*a* of an amplifier tube 7, is arranged to make contact with the other end of the inductance 2 or element 4, so that the tuner can be switched over between UHF and VHF operation, as desired. The cathode 7*a* of tube 7 is connected, via a high-frequency choke coil 8 and a resistor 9, which fixes the operating point, to the wall 5*a* of chamber 5, i.e., to ground. The control grid $7b$ of tube 7 is connected with a partition wall 10 of the tuner, i.e., to ground, so that the tube 7 operates in common grid configuration and is controlled at the cathode. The anode $7c$ of tube 7 is arranged in the second chamber 11 of the tuner casing. Also arranged in chamber 11 is an arcuate yoke 13 which is supported by an insulator 12. The free end portion 14 of the yoke 13 is connected, via a capacitor 15, with the anode of tube 7. The anode is also connected, via a high-frequency choke coil 16, to a terminal 17 connectible to the positive terminal of a source of operating voltage. A slide 19, which is insulatedly carried by a shaft 18 passing through chambers 5 and 11, establishes a metallic connection between the yoke 13 and the wall $11a$ of chamber 11, so that by rotating the shaft 18 and hence changing the angular position of the slide 19, the resonant tank circuit constituted by the yoke 13 and the chamber 11 can be tuned throughout the UHF range. If desired, there may be two yokes 13 arranged next to each other within the chamber 11, which two yokes can be grounded by means of a common slide. The arrangement as described so far is conventional.

According to the present invention, a pair of contacts 20, 21, are arranged at the end 14 of the yoke 13. One contact of each pair is arranged along a continuation of the yoke 13, these contacts being electrically insulated from the yoke 13 and from each other by means of insulating pieces 25, 26. The other contact of each pair is arranged so as to be in axial alignment with its mate, i.e., so as to be spaced from its mate in a direction substantially parallel to the axis of the shaft 18. One of the contacts of each pair—in the illustrated embodiment, the contact which is arranged along the continuation of the yoke 13—is connected to the anode $7c$ of the tube 7 while the other contact is connected to a respective inductance 22, 23. Each of the two inductances 22, 23, is connected to a variable capacitor and forms a resonant VHF circuit therewith. The slide 19 is rotatable with the shaft 18 beyond the end 14 of the yoke 13 and is movable into a position between the contacts 20 and from there to a position between the contacts 21, so that the slide 19 serves as a bridge which connects circuit 22, 24, or circuit 23, 24, to the anode of the tube 7. The two resonant VHF circuits are tuned by means of the capacitor 24, as, per se, is well known.

It will be appreciated that so long as the slide 19 is in a position in which it connects the yoke 13 to the wall of the chamber 11, the resonant VHF circuits 22, 24; 23, 24 will have no effect since the distance between the contacts 20, or between the contacts 21, will, in practice, be so large that there is, for all intent and purposes, no capacitative coupling. When, however, the slide 19 is between the contacts 20, or between the contacts 21, the corresponding resonant circuit, which is tunable throughout a portion of the VHF range by capacitor 24, is connected to the tube 7, at which time the yoke 13 will have no influence on the anode of tube 7 since the yoke 13 is at no place in metallic contact with the wall of chamber 11.

The amplified output signal of tube 7 is, in both UHF and VHF operation, taken off, for example, by means of an output coil (not shown) or by means of a line (not shown) passing through chamber 11 and connected to the anode of tube 7.

The slide 19, or, in practice, the shaft 18, is mechanically so coupled with the selector switch 6 as to cause the latter to move automatically from its UHF position to its VHF position as soon as the slide moves beyond the end 14 of the yoke 13 and one of the resonant VHF circuits is, by means of slide 19, connected to the tube 7. The mechanical coupling is explained more fully below in conjunction with FIGURE 3.

The input voltages are broadly coupled, in the input circuit, to the cathode $7a$ of tube 7 so that it is not necessary to change over or tune the input within the UHF range or within the VHF range.

The yoke can, as shown in FIGURE $1a$, be constituted by a conductive coating 113 applied to an insulated carrier plate $113a$. The contacts 120, 121, can then be formed by etching away the conductive coating at the places indicated at 125, 126.

The slide 19 is movable over the entire area of the yoke 13 so that the UHF tuning can be carried infinitely variably. Suitable detent means, however, may be provided for indexing the position of the slide 19 when it bridges contacts 20, 21. This may be accomplished, as shown in FIGURE $1b$, by means of a ratchet wheel $18a$ carried by the shaft 18 and coacting with a spring-pressed ball $18b$ or the like.

If desired, the resonant circuits may each have a fixed resonant frequency. Since the number of transmitting stations that can be satisfactorily received in the VHF range is usually limited, it is easily possible to provide as many sets of contacts corresponding to contacts 20, 21 as there are receivable television channels, e.g., there may be twelve sets of contacts so that each of channels 2 to 13 can be received. If a separate detent position is provided for each of these channels, the tuner may also be used as a channel selector switch for the channels within the VHF band.

Figure 2:
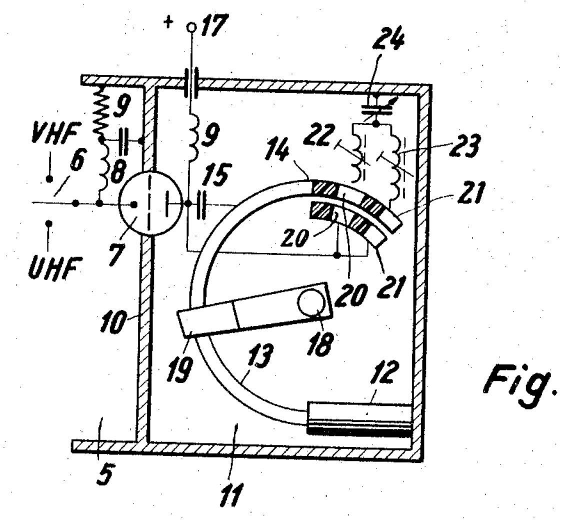
FIGURE 2 is a sectional view of another embodiment of a tuner according to the present invention.
Figure 1A:
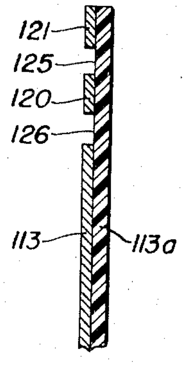
Figure 1B:
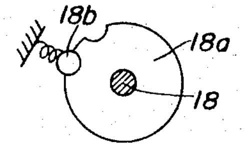

In the embodiment of FIGURE 2, the electrical connections of the component parts are as described above in conjunction with FIGURE 1, the physical arrangement of certain ones of the parts, however, being different. Thus, the yoke 13 is oriented differently, both it and the shaft 18 carrying the slide 19 having their common axis at right angles with respect to the orientation of the axis as shown in FIGURE 1. Furthermore, the contacts 20, 21, instead of being spaced axially apart are spaced apart in radial direction, and the slide 19, upon reaching the end 14 of the yoke 13, runs up onto the pairs of contacts and comes out of engagement with the wall of the tuner.

The above-described structure is susceptible to various modifications. For instance, the slide 19 may be provided with a plurality of contact fingers which are insulated from each other and which, when the tuner is operating in the VHF band, coact with other contact pairs that are insulated from each other and that serve to carry out other switching functions, depending on the detent position of the slide. For example, the operating voltage of the tube may be changed, or an indicating lamp, showing the band and/or channel to which the tuner is set, may be energized. Also, the shaft 18 may have a detent position in which an on-off switch for the receiver is actuated.

It is not essential that the element hereinabove referred to as a yoke be arcuate. Instead, the inner conductor of the tank circuit can be rectilinear, in which case the element which connects the inner conductor with the wall or outer conductor of the tank will likewise be made to move rectilinearly. Such a slide can readily be moved between its various positions by means of a push-button arrangement; depending on which button is pushed, the slide will connect a given point along the inner conductor to the outer conductor, or the slide will bridge the desired set of contacts 20, 21, for purposes of VHF reception.

Figures 3, 4:
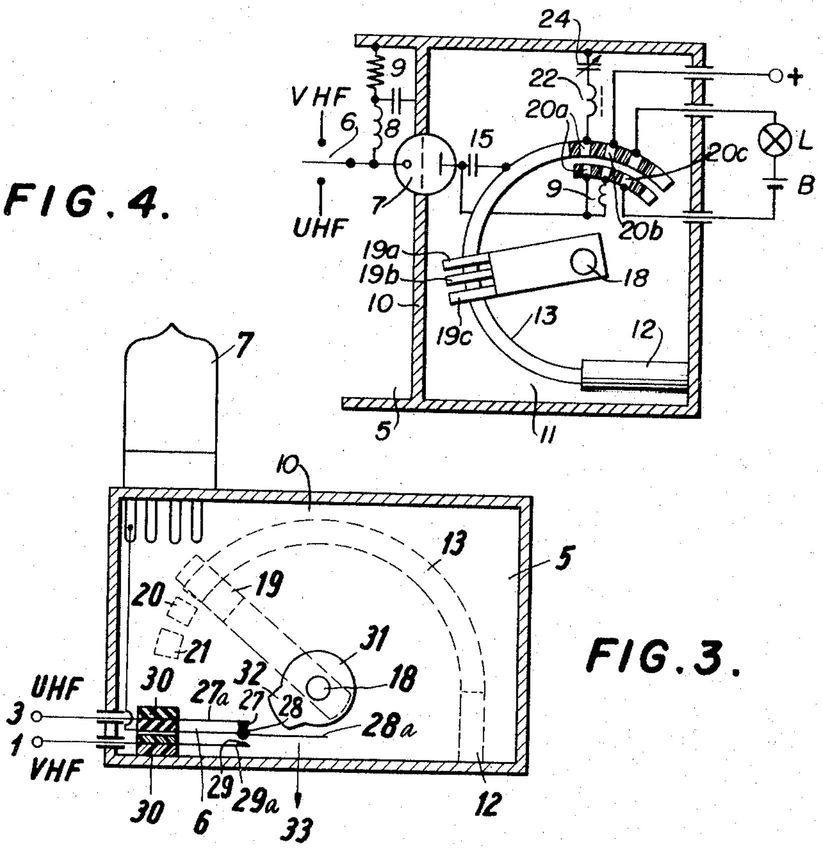
FIGURE 3 is a sectional view of the tuner of FIGURE 1, taken in a plane at right angles to that of FIGURE 1, and shows the mechanical structure of the selector switch mechanism by means of which the amplifier input is automatically connected to the UHF or VHF input terminal, depending on the position of the slide.
FIGURE 4 is a sectional view of a modification of a tuner according to the present invention wherein additional switching operations are performed.

FIGURE 3 shows the mechanical interconnection between the shaft and the change-over switch 6, the arrangement being such that so long as the slide moves along the UHF portion of yoke 13, the UHF input is activated while the VHF input is activated as soon as the slide is interposed between the VHF contacts 20, 21, etc. The switch 6 includes three contacts 27, 28, 29, carried by leaf springs $27a$, $28a$, $29a$, respectively, which leaf springs are connected to the wall $5a$ by means of insulating spacers 30. Contact 27 is connected to the UHF terminal 3 while contact 29 is connected to the VHF terminal 1. The rest position of the switch is such that, when no external forces are applied, the contacts 27 and 28 are in engagement with each other, the contact 28 being, however, out of engagement with contact 29.

The shaft 18 carries a cam 31 which is arranged to engage the leaf spring $28a$ and to move the same in the direction of arrow 33, thereby to separate contacts 27 and 28 and causing engagement of contacts 28 and 29, as soon as the shaft is rotated into a position in which the slide 19 no longer contacts the UHF portion of the yoke 13 but comes to lie between the first contact pair 20. The cam 31 will, of course, hold the switch 6 in this position also when the slide is between contacts 21 and any additional pairs of contacts used for VHF operation. In this way, the UHF terminal 3 is connected to tube 7 whenever the slide acts on the UHF portion of the yoke 13, while the VHF terminal is connected to tube 7 whenever the slide coacts with the VHF contacts 20, 21.

In the embodiment of FIGURE 4 wherein like references denote like parts as in the other figures the slide 19 consists of three insualted contact fingers 19*a*, 19*b*, 19*c*. Each of these fingers connects corresponding separated contact elements 20*a*, 20*b*, 20*c* of one contact 20 when the shaft 18 is turned to one fixed position for VHF operation. It will be noted that several contacts 20, 21 will be provided each consisting of three contact elements; but only one contact 20 is shown in the drawing. Contact element 20*a* connects circuit 22, 24 to the anode of the tube 7 for VHF operation as described in connection with FIGURE 2. Contact element 20*b* connects suitable operating voltage to the anode of the tube 7 which voltage may be different for UHF and VHF operation. Contact element 20*c* energizes by means of a voltage source B an indicating lamp L indicating VHF operation or indicating the VHF channel to which the tuner is set. In this case several lamps L would be provided one for each contact 20, 21 each lamp indicating one VHF channel.

Figure 5:
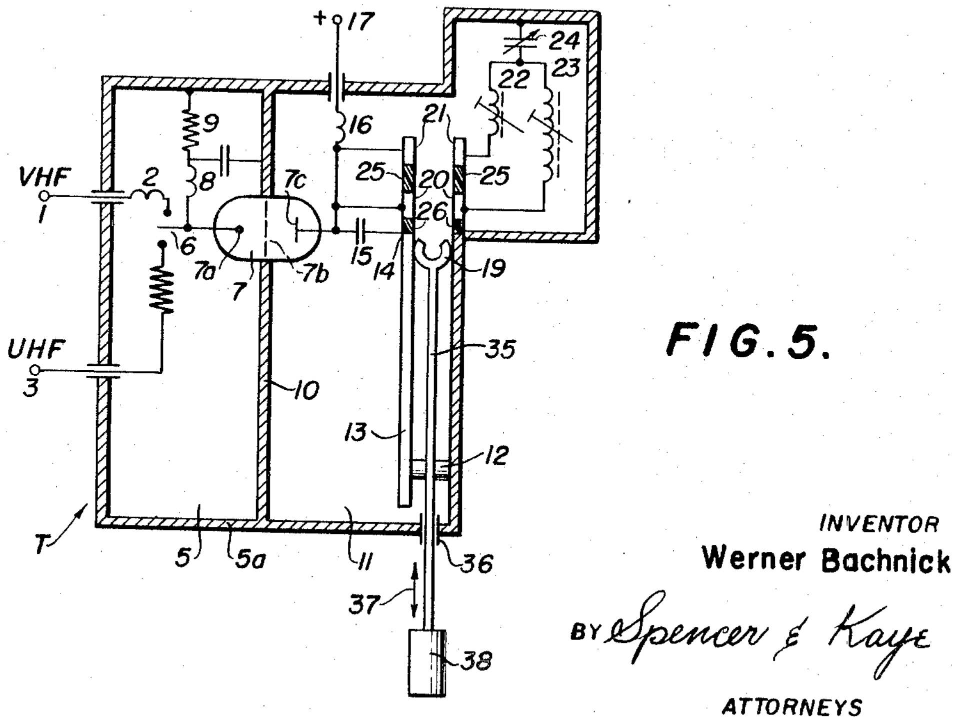
FIGURE 5 is a sectional view of a modification of the embodiment of FIGURE 1 wherein the inner conductor is rectilinear.

In FIGURE 5 wherein like references denote like parts as in FIGURE 1 the yoke 13 is of rectilinear form. The slide 19 is mounted on a driving rod 35 which is supported within a bearing 36 and can be moved in longitudinal direction, i.e. along the direction of the arrow 37 by a push-button 38. It will be noted that yoke 13 as well as rod 35 are of rectilinear form. Preferably several push-buttons are provided each of which, if operated, shifts the rod to a predetermined position corresponding to an UHF or VHF channel.

It will be understood that the above description of the present invention is suscepible to various modifications, changes, and adaptations, and the same are intended to be comprehended within the meaning and range of equivalents of the appended claims.

What is claimed is:

1. A combined UHF and VHF tuner comprising, in combination:

(a) an amplifier;

(b) a UHF tuning circuit incorporating wall means constituting an outer conductor forming a chamber and an inner conductor arranged within said chamber and insulated from said wall means, said inner conductor being connected to an electrode of said amplifier;

(c) a slide arranged in said chamber for movement along said inner conductor for connecting the same, at any point along the length thereof, to said wall means;

(d) VHF circuit means; and (e) contact means including at least one apir of contacts one of which is connected to said electrode of said amplifier and the other of which is connected to said VHF circuit means, said contacts being arranged at an end of said inner conductor along the path of movement of said slide beyond said inner conductor, to be bridged by said slide when the same has moved beyond said inner conductor and into engagement with said contacts, whereby said slide may, selectively, connect said UHF tuning circuit and said VHF circuit means to said electrode of said amplifier.

2. A tuner as defined in claim 1 wherein said inner conductor is an arcuate yoke and said slide is mounted on a rotatable shaft.

3. A tuner as defined in claim 2 wherein said VHF circuit means comprise lumped circuit elements.

4. A tuner as defined in claim 2 wherein said VHF circuit means form a plurality of VHF circuits, and wherein said contact means include a plurality of pairs of contacts successively bridgeable by said slide, each pair of contacts being associated with a respective one of said plurality of VHF circuits.

5. A tuner as defined in claim 4 wherein said VHF circuit means include a variable circuit element, whereby each VHF circuit may be tuned.

6. A tuner as defined in claim 4 wherein each of said VHF circuit means is tuned to a respective fixed frequency.

7. A tuner as defined in claim 2 wherein said yoke and one contact of each pair of contacts are combined to form a single structural entity.

8. A tuner as defined in claim 7 wherein said entity comprises an insulating plate, a conductive coating on said plate and serving as said inner conductor, said contacts pertaining to said entity being insulated from said coating.

9. A tuner as defined in claim 8 wherein said contacts pertaining to said entity are insulated from each other.

10. A tuner as defined in claim 2, further comprising:

(f) UHF input means;

(g) VHF input means; and (h) selector switch means for selectively connecting said two input means to the input of said amplifier.

11. A tuner as defined in claim 10, further comprising:

(i) means mechanically interconnecting said slide and said selector switch means for causing the latter to connect said UHF input means to said amplifier input while said slide coacts with said inner conductor of said UHF tuning circuit and to connect said VHF input means to said amplifier input while said slide is in a position beyond said inner conductor and coacts with said contact means.

12. A tuner as defined in claim 11 wherein said selector switch means comprises an actuating element for moving said switch means between two positions in one of which said UHF input means are connected to said amplifier input and in the other of which positions said VHF input means are connected to said amplifier input, and wherein said mechanical means comprise a cam carried by said shaft and coacting with said actuating element.

13. A tuner as defined in claim 2 wherein the two contacts of said pair are spaced from each other in the direction of the axis of said shaft.

14. A tuner as defined in claim 2 wherein the two contacts of said pair are spaced from each other radially with respect to the axis of said shaft.

15. A tuner as defined in claim 2 wherein said slide is movable steplessly over the length of said inner conductor.

16. A tuner as defined in claim 4, further comprising indexing means for holding said slide in a position in which it bridges a given pair of contacts.

17. A tuner as defined in claim 16 wherein said shaft carries additional slide means, the same being insulated from said slide and coacting with additional contact means in each indexed position of said shaft.

18. A tuner as defined in claim 16 wherein said indexing means are arranged to hold said slide in a further indexed position in which an on-off switch for a receiver with which the tuner is associated is actuated.

19. A combined UHF and VHF tuner comprising, in combination: a casing having wall means and a partition dividing said casing into two chambers; an amplifier element having first, second and third electrodes, said first electrode being grounded to said casing; a VHF input terminal and a UHF input terminal; selector switch means arranged in one of said chambers for selectively connecting said input terminals to said second electrode of said amplifier element; an arcuate inner conductor arranged in the other of said chambers and forming together with an outer conductor constituted by said partition and so much of said wall means as pertains to said other chamber a UHF tuning circuit, said inner conductor being insulated from said outer conductor and electrically connected to said third electrode of said amplifier element; a rotary shaft passing through said chambers and being coaxial with said arcuate inner conductor; a slide carried by said shaft and arranged in said second chamber for movement along said inner conductor for connecting the same, at any point along the length thereof, to said outer conductor; lumped circuit elements forming a plurality of VHF resonant circuits; and a plurality of pairs of contacts, one contact of each pair being connected to said third electrode of said amplifier element and the other electrode of each pair being connected to a respective one of said plurality of VHF resonant circuits, said contacts being arranged at an end of said inner conductor along the path of movement of said slide beyond said inner conductor, the two contacts of each pair being bridged by said slide when the same has moved beyond said inner conductor and into engagement with the two contacts for connecting to said third electrode of said amplifier the particular VHF circuit associated with said pair of contacts, whereby said slide may, selectively, connect said UHF tuning circuit and said VHF circuit means to said third electrode of said amplifier element; mechanical means interconnecting said shaft and said selector switch means for causing the latter to connect said UHF input terminal to said second electrode of said amplifier element while said slide connects said inner conductor of said UHF tuning circuit to said outer conductor thereof and to connect said VHF input terminal to said second electrode of said amplifier element while said slide is in a position beyond said inner conductor and bridges a pair of contacts; and indexing means for holding said slide in a position in which it bridges a pair of contacts.

20. A tuner as defined in claim 1 wherein said inner conductor is rectilinear.

21. A tuner as defined in claim 20, further comprising push-button means for moving said slide.

References Cited by the Examiner

UNITED STATES PATENTS

| | | | |
|---|---|---|---|
| 2,513,392 | 7/1950 | Aust | 334—41 |
| 2,817,064 | 12/1957 | Carlson | 334—3 X |
| 2,871,360 | 1/1959 | Lyman | 334—3 |

KATHLEEN H. CLAFFY, *Primary Examiner.*

R. LINN, *Assistant Examiner.*